(12) United States Patent
Ortiz et al.

(10) Patent No.: US 11,360,169 B2
(45) Date of Patent: Jun. 14, 2022

(54) APPARATUS FOR NON-GALVANIC CONNECTION OF MRI RECEIVE COIL TO MRI SYSTEM USING RF-OVER-FIBER

(71) Applicant: KONINKLIJKE PHILIPS N.V., Eindhoven (NL)

(72) Inventors: Timothy Ortiz, Alachua, FL (US); Tracy Allyn Wynn, Gainsville, FL (US); Olli Tapio Friman, Gainsville, FL (US)

(73) Assignee: Koninklijke Philips N.V., Eindhoven (NL)

( * ) Notice: Subject to any disclaimer, the term of this patent is extended or adjusted under 35 U.S.C. 154(b) by 33 days.

(21) Appl. No.: 16/967,775

(22) PCT Filed: Jan. 28, 2019

(86) PCT No.: PCT/EP2019/051931
§ 371 (c)(1),
(2) Date: Aug. 6, 2020

(87) PCT Pub. No.: WO2019/154641
PCT Pub. Date: Aug. 15, 2019

(65) Prior Publication Data
US 2021/0396823 A1 Dec. 23, 2021

Related U.S. Application Data

(60) Provisional application No. 62/628,354, filed on Feb. 9, 2018.

(51) Int. Cl.
*G01R 33/36* (2006.01)

(52) U.S. Cl.
CPC ..... *G01R 33/3621* (2013.01); *G01R 33/3692* (2013.01)

(58) Field of Classification Search
CPC .............. G01R 33/3621; G01R 33/3692
See application file for complete search history.

(56) References Cited

U.S. PATENT DOCUMENTS

| 5,545,999 A | 8/1996 | Mueller et al. |
| 8,847,598 B2 * | 9/2014 | Hardy .................... G16H 40/67 324/322 |

(Continued)

FOREIGN PATENT DOCUMENTS

| DE | 102016206286 A1 | 5/2017 |
| WO | 2014024114 A1 | 2/2014 |

OTHER PUBLICATIONS

Zhang Bo et al., "A Wireless Access Architecture Based on Radio over Fiber Technology for Telemedicine System" 2007 IEEE/ICME International Conf. on Complex Medical Engineering (2007).

(Continued)

*Primary Examiner* — Dixomara Vargas

(57) ABSTRACT

A magnetic resonance (MR) receive device comprises a coil or coil array including at least one radiofrequency (RF) coil element wherein each RF coil element comprises a coil and a preamplifier connected to amplify an output of the RF coil element to generate an amplified RF signal. The MR receive device further includes an RF-over-Fiber module comprising an optical fiber, a photonic device optically coupled to send an optical signal into the optical fiber, and an RF modulator connected to modulate the optical signal by an MR signal comprising the amplified RF signal.

19 Claims, 6 Drawing Sheets

(56) References Cited

U.S. PATENT DOCUMENTS

| | | |
|---|---|---|
| 9,536,423 B2 | 1/2017 | Griswold et al. |
| 2011/0116794 A1 | 5/2011 | George et al. |
| 2013/0011139 A1* | 1/2013 | Hardy .................. H04B 10/801 398/79 |
| 2016/0097275 A1 | 4/2016 | Santoso |
| 2016/0228005 A1 | 8/2016 | Bammer et al. |

OTHER PUBLICATIONS

A. Chowdhury, H. Chien, S. Khire, S. Fan, N. Jayant and G. Chang, "Converged broadband optical and wireless communication infrastructure for next-generation telehealth," The 12th IEEE International Conference on e-Health Networking, Applications and Services, Lyon, 2010, pp. 23-27, doi: 10.1109/HEALTH.2010.5556562.

Motoharu Matsuura et al., "Bidirectional Radio-Over-Fiber Systems Using Double-Clad Fibers for Optically Powered Remote Antenna Units" IEEE Photonics Journal, vol. 7, No. 1 Feb. 2015.

Gee-Kung Chang et al. "Emerging Heterogeneous Optical Wireless Access Networks for Next Generation Telemedicine and Telehealth Applications" The 16th Opto-Electronics and Communications Conference Jul. 4-8, 2011.

Jun Tang et al., "A Hybrid Radio over Fiber Wireless Sensor Network Architecture" Wireless Communications Network and Mobile Computing 2007 p. 2675-2676.

Tetsuya Kawanishi et al., "Electro-Optic Devices for Imaging Systems Using Radio-over-Fibre" 2014 16th International Conf. on Transparent Optical Networks (2014).

International Search Report and Written Opinion from PCT/EP2019/051931 dated May 16, 2019.

\* cited by examiner

APPARATUS FOR NON-GALVANIC CONNECTION OF MRI RECEIVE COIL TO MRI SYSTEM USING RF-OVER-FIBER

CROSS REFERENCE TO RELATED APPLICATIONS

This application is a U.S. national phase application of International Application No. PCT/EP2019/051931 filed on Jan. 28, 2019 which claims the benefit of U.S. Provisional Application Ser. No. 62/628,354 filed on Feb. 9, 2018 and is incorporated herein by reference.

FIELD

The following relates generally to magnetic resonance (MR) receive systems, MR coils and coil arrays, MR imaging systems, and the like.

BACKGROUND

MR receive coils and coil arrays are conventionally connected with the system-side RF receiver by way of electrically conductive (i.e. galvanic) cables. This has certain disadvantages such as potential for conductive coupling of the cable with magnetic field gradients and/or RF transmit pulses leading to potential for heating and/or added noise.

Indeed, cabling in MRI coils has been a challenge almost since the very first receive coils were created. Cabling serves a variety of functions, but can be broken down into two general categories: internal cabling and external. Internal cabling conducts RF signals from individual elements to other parts of the coil electrical structure and conducts power and switching signals from the coil/system interface to the individual elements. External cabling, or "system" cabling is the coil's cable tether to the MRI system. This sort of cable usually extends from the external coil housing to a proprietary connector at the system.

One drawback to cables, whether internal or external, is that it is difficult to prevent them from conducting unintended signals, coupled via electric and magnetic fields from the external environment. The MRI suite is a rather "noisy" RF environment, particularly near the Larmor frequency. The intensity of these unwanted fields can be large enough to create currents and voltages on cables that pose a danger to the coil and, sometimes, to patients. This is particularly true of system cables which must often be routed on or near patient tissues. Cables also suffer from both high cost of manufacture and a relatively high susceptibility to breakage during use due to their inherent flexibility and mobility, which can lead them to be treated like "handles," or subject them to impact forces as cables swing freely from coil housings.

The following discloses certain improvements.

SUMMARY

In one disclosed aspect, magnetic resonance (MR) receive device includes a coil or coil array including at least one radiofrequency (RF) coil element wherein each RF coil element comprises a coil and a preamplifier connected to amplify an output of the RF coil element to generate an amplified RF signal. The MR receive device further includes an RF-over-Fiber module comprising an optical fiber, a photonic device optically coupled to send an optical signal into the optical fiber, and an RF modulator connected to modulate the optical signal by an MR signal comprising the amplified RF signal.

In some embodiments, the RF-over-Fiber module is configured to power the MR coil or coil array by one of: delivering optical power continuously to MR coil or coil array; or delivering optical power to a battery or storage capacitor of the MR coil or coil array.

In some embodiments, the at least one RF coil element comprises a plurality of RF coil elements and the MR coil or coil array further includes one or more RF mixers connected to respective RF coil elements, each RF mixer frequency shifting the RF signal of the corresponding RF coil element to a designated frequency for that RF coil element. In some implementations, the MR signal comprises a frequency domain multiplexed (FDM) combination of the frequency shifted RF signals of the plurality of RF coil elements.

In some embodiments, the MR receive device further includes a second RF-over-Fiber module configured to send at least one oscillator signal to the one or more RF mixers.

In some implementations, the second RF-over-Fiber module is configured to power the at least one radiofrequency coil by one of: delivering optical power continuously to the MR coil or coil array; or delivering optical power to a battery or storage capacitor of the MR coil or coil array.

In some implementations, the coil or coil array further comprises at least one coil side local oscillator (LO) connected to send at least one oscillator signal to the one or more RF mixers.

In some embodiments, the MR coil or coil array further comprises a summer configured to sum the frequency shifted RF signals of the plurality of RF coil elements to generate the MR signal.

In some embodiments, the MR receive device further includes an MR receiver including an analog-to-digital converter ($ADC_{DATA}$) configured to: receive the optical signal modulated by the MR signal from the optical fiber of the RF-over-Fiber module; extract the MR signal from the received optical signal and convert the MR signal to a digital signal; and transmit the digital signal to a digital signal processing (DSP) unit.

In some embodiments, a magnetic resonance (MR) imaging system includes: an MR scanner including a magnet generating a static ($B_0$) magnetic field; an MR receive device as set forth above; an RF receiver configured to extract the MR signal from the optical signal modulated by the MR signal received from the RF-over-Fiber module; and an MR reconstruction processor comprising an electronic processor programmed to reconstruct the extracted MR signal to generate a reconstructed MR image.

In another disclosed aspect, a magnetic resonance (MR) receive device includes: a coil array including a plurality of radiofrequency (RF) coil elements wherein each RF coil element comprises a coil and outputs an RF signal; frequency domain multiplexing (FDM) circuitry including one or more RF mixers and a signal combiner, the FDM circuitry configured to output a multiplexed MR signal in which the RF signals are frequency shifted to a plurality of RF channels of the multiplexed MR signal; and an RF-over-Fiber module comprising an optical fiber, a photonic device optically coupled with the optical fiber to launch light into the optical fiber, and an RF modulator connected to modulate the light by the multiplexed MR signal.

In some implementations, the FDM circuitry is integrated with the coil array as a coil unit and the RF-over-Fiber module connects with the coil unit.

In some implementations, the MR receive device further comprises a second RF-over-Fiber module connected with the coil unit and configured to convey an oscillator signal to each RF mixer of the FDM circuitry.

In some implementations, the coil unit does not include a local oscillator.

In some implementations, the coil unit is configured to be powered at least partially by optical power conveyed to the coil unit via the second RF-over-Fiber module.

In some implementations, the FDM circuitry further includes one or more coil-side local oscillators integrated with the coil unit and supplying an oscillator signal to each RF mixer of the FDM circuitry.

In some implementations, there is no galvanic cable connected with the coil unit. In other implementations, one or more galvanic cables are connected to the coil unit, for example a galvanic cable may be provided to supply operational electric power to the coil unit.

In another disclosed aspect, a MR imaging method includes, with a preamplifier (LNA), receiving an output of a radiofrequency coil element, and generating an amplified radio frequency signal of the coil element. And, with a RF-over-Fiber module coupled to the preamplifier (LNA): using a photonic device of the RF-over-Fiber module to convert the amplified radio frequency signal to an optical signal modulated by the amplified radio frequency signal, and transmitting the optical signal modulated by the amplified radiofrequency signal over an optical fiber of the RF-over-Fiber module.

In some implementations, the method further includes, with a second RF-over-Fiber module, sending at least one local oscillator (LO) signal to a mixer connected to the preamplifier (LNA).

In some embodiments, the method further includes, with an analog-to-digital converter ($ADC_{DATA}$) located outside the RF-over-Fiber module: receiving the optical signal modulated by the amplified radiofrequency signal from the RF-over-Fiber module; and converting the optical signal modulated by the amplified radiofrequency signal to a digital signal representing the amplified radiofrequency signal.

In some implementations, the at least one radiofrequency coil comprises a plurality of radio frequency coils; and the method further comprises frequency domain multiplexing the amplified radiofrequency signals of the plurality of coils to generate a frequency domain multiplexed signal. In some implementations, the photonic device of the RF-over-Fiber module converts the frequency domain multiplexed to the optical signal modulated by the frequency domain multiplexed signal.

One advantage resides in simplified coil-side implementation (e.g., no need for on-coil A/D circuitry).

Another advantage resides in providing optical transmission of receive coil signals having compatibility with analog system-side RF receive chains.

Another advantage resides in reduced power consumption at the coil.

Another advantage resides in the possibility of providing power to the RF receive coil over the optical fiber.

Another advantage resides in a more flexible cable.

Another advantage resides in a lighter-weight cable.

Another advantage resides in providing for multiplexed transmission over optical fiber of the signals from a coil or coil array having multiple receive channels.

A given embodiment may provide none, one, two, more, or all of the foregoing advantages, and/or may provide other advantages as will become apparent to one of ordinary skill in the art upon reading and understanding the present disclosure.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION

Figure 1:
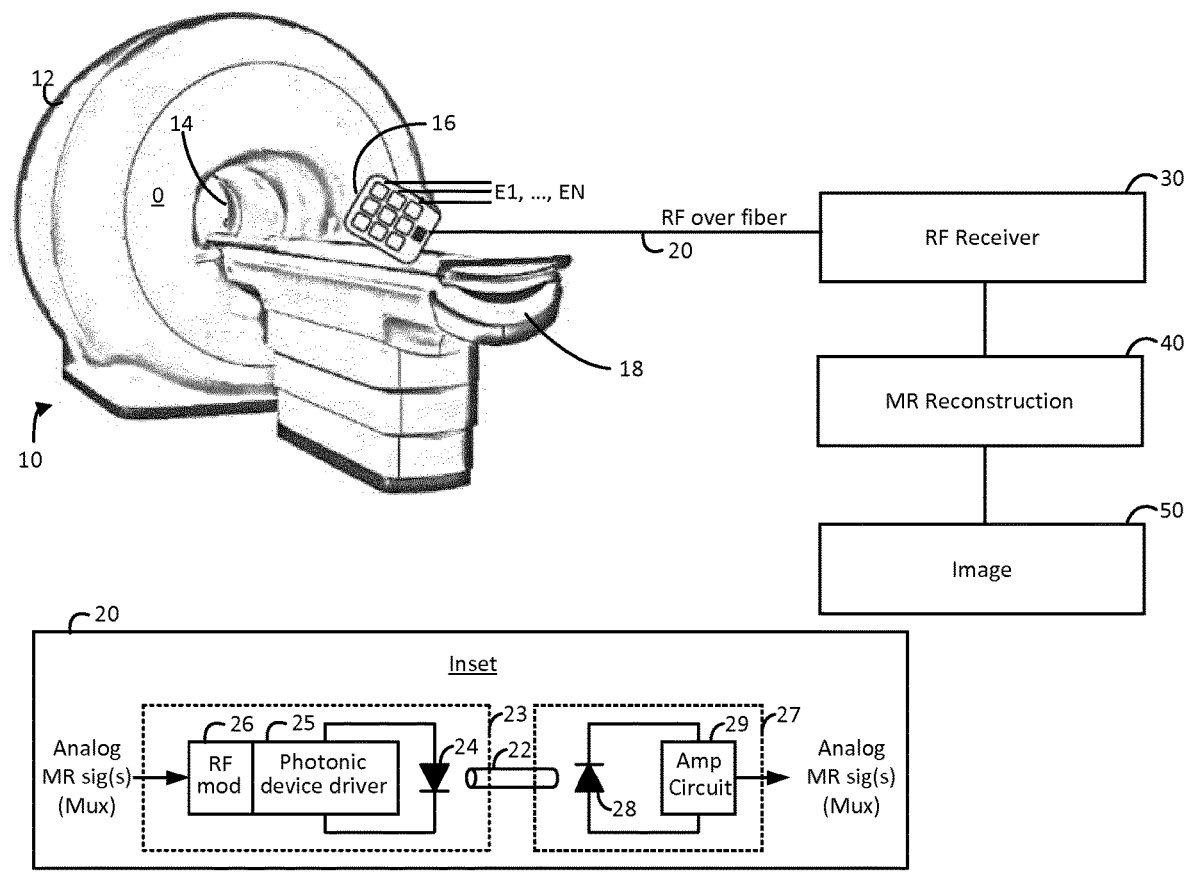
FIG. 1 diagrammatically illustrates a magnetic resonance (MR) imaging device including a receive coil array connected with an RF receiver via RF over fiber. The Inset of FIG. 1 shows diagrammatic details of the RF over Fiber link between the MR receive coil and the RF receiver.

With reference to FIG. 1, an illustrative medical imaging device 10 comprises a magnetic resonance (MR) imaging scanner, which in the illustrative example includes a housing or gantry 12 containing various components which are not shown in FIG. 1, such as by way of non-limiting illustrative example a superconducting or resistive magnet generating a static ($B_0$) magnetic field, magnetic field gradient coils for superimposing magnetic field gradients on the $B_0$ magnetic field, a whole-body radio frequency (RF) coil and/or one or more local coils or coil arrays for applying RF pulses to excite and/or spatially encode magnetic resonance in an imaging subject disposed in an MR bore 14 or other MR examination region, and/or so forth. In the illustrative embodiments, a coil or coil array 16 is provided for receiving MR signals. The illustrative coil array 16 includes a 3×3 array of coil elements which may be indexed E1, E2 . . . $E_N$ (in the illustrative 3×3 coil array, N=9, but more generally N can be one, two, three, four, or higher, e.g. some coil arrays may have dozens of coil elements). It is contemplated for the coil or coil array to include as few as a single coil element. The "coil element" as used herein refers to the antenna (or electrically conductive pick-up loop, or so forth) E1, E2 . . . $E_N$ that resonates at the MR frequency to detect an MR signal, while the term "coil" or "coil array" 16 refers to the local coil as a whole including the one or more coil elements E1, E2, . . . , $E_N$ together with associated electronics such as a low-noise amplifier (LNA) typically connected with each coil element to provide initial (pre-)amplification, control circuitry for detuning the receive coil during the RF transmit phase, and/or so forth disposed on a printed circuit board with interconnecting printed circuitry or otherwise assembled. The illustrative coil array 16 is constructed as a coil unit, that is, the coil elements E1, E2 . . . $E_N$ and associated electronics, printed circuit board, et cetera are assembled as a coil unit. The coil unit may in some embodiments be flexible, e.g. so to conform with the curvature of patient anatomy, and/or may be shaped to fit over or be secured with the patient, e.g. in the case of a limb coil that has an annular ring or cuff form factor to go around an arm or leg, or a head coil that conformably fits over a patient's head. A robotic patient couch 18 or other subject support enables loading a medical patient, a subject undergoing a medical screening, or other imaging subject into the MR bore 14 for imaging. The local coil or coil array 16 is placed onto or proximate to the patient (and, in some cases, more specifically over a patient's limb, head, or other specific anatomy) to facilitate close electromagnetic coupling between the coil element(s) E1, E2, . . . , $E_N$ and MR excited in the patient or specific anatomy. It should be noted that while FIG. 1 illustrates a single local coil 16, in some imaging sessions a plurality of local coils (each of which may be a coil or coil array) may be employed to provide desired MR signal capture.

An RF-over-fiber module or connection 20 is employed to transmit the MR signal(s) received by the coil element(s) E1, E2, . . . , $E_N$ off the receive coil array 16. The RF-over-fiber module or connection 20 includes an optical fiber 22, an optical transmit assembly 23 including a photonic device 24 (e.g. an LED, laser diode, or so forth) driven by a photonic device driver 25 at the coil side, and an RF modulator 26 that modulates the optical signal output by the photonic device 24 by an MR signal. In the illustrative optical transmit assembly, the RF modulator 26 modulates the electrical current or power supplied by the photonic device driver 25 to the photonic device 24 in order to achieve RF modulation of the optical signal (i.e. light launched into the optical fiber 22). In other words, the illustrative RF modulator 26 modulates the intensity of the light output by the photonic device 24. Alternatively to modulating the intensity, another property of the light, such as wavelength, phase, polarization, may be altered. Also, a pulse width modulation (PWM)-type encoding scheme may be used. In an alternative configuration (not shown), the RF modulator may be embodied as an electro-optic modulator such as a liquid crystal device (LCD) that is interposed between the photonic device 24 and the optical coupling into the optical fiber 22; in this alternative embodiment, the photonic device 24 outputs light at a constant intensity and the electro-optic device implements the RF modulation by attenuating the light output by the photonic device in accord with the MR signal. As other variations, the LCD modulator could introduce polarization modulation or some other type of modulation in accord with the MR signal in order to generate the RF-over-Fiber signal, rather than using intensity modulation. The RF-over-fiber module or connection 20 further includes, at the distal end of the optical fiber 22, an optical receive assembly 27 including a photodetector 28 (e.g. a photodiode, photoconductive device, or the like) connected with an amplifier circuit 29 that extracts the MR signal from the RF-modulated light launched by the optical transmitter assembly 24, 25, 26. The amplifier circuit 29 may, for example, comprise an operational amplifier (op-amp) based circuit that converts photocurrent of the photodetector 28 into a photovoltage with a design-basis output impedance suitable for coupling to downstream analog RF signal processing circuitry.

The use of the RF-over-fiber module or connection 20 for porting the MR signal off the MR receive coil or coil array 16 has substantial advantages over other approaches for porting the MR signal(s) off the receive coil. The optical fiber 22 is non-galvanic and does not electromagnetically couple with magnetic fields or RF fields generated by the MR scanner 10. This avoids safety issues that can arise when electrical currents are induced in a galvanic cable, and reduces the potential for introducing noise into the transmitted MR signal. The use of RF-over-fiber, in particular, has substantial advantages as recognized herein. Because the MR signal is transmitted as an RF signal, it does not need to be heterodyned to baseband for transmission. Furthermore, as disclosed later herein, in the illustrative case of a coil array 16 the RF signals detected by the multiple coil elements E1, E2, . . . , $E_N$ can be combined by frequency shifting the RF signals to designated channels and then combining the frequency shifted RF signals to form a frequency domain multiplexed (FDM) MR signal that is input to the RF modulator 26 of the RF-over-fiber module or connection 20. If there are N coil elements E1, E2, . . . , $E_N$ then there are N channels in the FDM MR signal. In one approach, N−1 of the N RF signals are frequency shifted to a designated RF channel which is shifted away from MR frequency while one of the N channels is not frequency shifted and hence remains at the MR frequency. (Said another way, the MR frequency is one of the N channels of the FDM MR signal). In an alternative approach, every one of the N RF signals is frequency shifted to a designated RF channel, so that the MR frequency is not one of the N channels of the FDM MR signal. This latter approach may be beneficial in limiting noise pickup in the electronics of the MR receive coil 16 since the MR scanner 10 generates a particularly large amount of noise at the MR frequency. Another advantage of using RF-over-Fiber is that it is possible to transmit optical power to the receive coil 16 over the RF-over-Fiber module or connection 20. A still further advantage resides in the fact that the (possibly multiplexed) coil signal output by the amplifier circuit 29 is an analog RF signal, which is the same as the analog RF signal that is received when using a simple galvanic cable to transmit the RF signal picked up by the coil element (and optionally amplified by a LNA). As a result, the (optionally multiplexed) MR signal output by the RF over fiber module or connection 20 can be input to and processed by a conventional RF receiver designed to receive and process an MR signal in its "as picked up" analog RF signal form. This also means that the coil unit 16 does not need to include additional processing circuitry such as a demodulator, analog-to-digital conversion circuitry, or so forth.

With reference now returning to the main drawing of FIG. 1, the RF-over-fiber module or connection 20 is employed to transmit the received analog RF signal off the coil via an optical fiber 20 to an RF receiver 30. To this end, the analog (optionally multiplexed) MR signal output by the amplifier circuit 29 of the RF-over-Fiber module or connection 20 inputs to the RF receiver 30. As just noted, this is an analog signal that can be processed identically to the way an analog MR signal received from an MR receive coil via a galvanic cable is processed. This facilitates use of RF receivers of legacy MR systems designed to receive and process analog MR signals. An MR reconstruction processor 40 comprising a computer or other electronic processor programmed by instructions stored on a non-transitory storage medium (e.g. a hard disk or other magnetic storage medium, a FLASH memory, solid state drive or other electronic storage medium, an optical disk or other optical storage medium, some combination of two or more of the foregoing, or so forth) reconstructs the MR signals using an MR reconstruction algorithm appropriate for the spatial encoding of the magnetic resonance (e.g. a Fourier transform reconstruction or so forth), and an image 50 is then produced which may be displayed on a display (not shown, e.g. an LCD display, OLED display, or so forth), processed using various image processing technologies, and/or otherwise utilized.

Embodiments described herein use RF-over-Fiber (and optionally Power-over-Fiber) technology which allows the transmission of a high-bandwidth MR signal from a transmitter 24, 25, 26 to a receiver 28, 29 over a non-electrically-conductive (non-galvanic) optical fiber 22. In some embodiments, the RF over fiber 20 has a bi-directional configuration such that narrow-bandwidth mixing reference signals can be provided to both the coil side and the system side of the connection. In this way, it is feasible to multiplex the MR data from multiple MR receive coil elements (e.g. antennas) $E1, E2, \ldots, E_N$ on a single fiber 22, resulting in a simple, flexible, and safe alternative to a traditional galvanic coil cable.

The disclosed improvement employs RF-over-fiber to transmit the received analog RF signal off the coil via the optical fiber 20. This has advantages over an on-coil A/D to fiber signal chain, including simpler coil-side implementation (no need for on-coil A/D circuitry); compatibility with analog system-side RF receive chains; reduced power consumption at the coil; and the possibility of providing power to the RF receive coil over the optical fiber.

In addition, one problem solved by embodiments described herein is the danger to the patient that is inherent in galvanic system cabling and supporting components between coil and MRI system. In removing the requirement for safe positioning of a galvanic cabling, embodiments described herein also solve the problems experienced by technologists in creating a safe cable arrangement for every scan and further solves the problem of the need to provide extensive training to technologists so that they can perform this function adequately.

Furthermore, as will be seen, some embodiments advantageously allow for a "universal" cable in the sense that differentiation for coil and/or system specifics could be confined to the coil design or the system connector design. Still further, some embodiments advantageously remove the need for a digital "merger" in a "digital" coil.

Also advantageously, some embodiments remove the need for safety mechanisms, such as baluns, that are typically used in MRI coils to control unwanted currents on coil system cables. Some embodiments do so by converting the data-carrying galvanic cables into glass or plastic fiber-optic cables that do not conduct electrical currents.

Moreover, some embodiments advantageously have the potential to allow a single coil design to be used across multiple Original Equipment Manufacturer (OEM) systems simply by using a different system cable and system interface converter. The same cable could also be used for multiple field strength applications (e.g., the same cable could be used to connect a 1.5 T or a 3.0 T coil, in principle).

Disclosed embodiments leverage RF-over-fiber technology in which the photonic device driver 25 comprises a transistor which is used to drive the optical device 24 (e.g. laser) that injects light into the fiber 22, and the transistor (or more generally the photonic device driver 25) is modulated at the RF frequency so as to modulate the injected light at the RF frequency. The modulation is preferably highly linear to avoid introducing distortion, should have high dynamic range, and has good sensitivity (noise figure). In contemplated alternative embodiments (not shown), the RF modulator comprises an electro-optic device (e.g. LCD modulator) to directly modulate light output by the optical device 24 (here the light output by the optical device 24 is of constant intensity, and is modulated by the downstream electro-optic RF modulator).

In practice, the local receive coil is sometimes a coil array (e.g. illustrative coil array 16 including a 3×3 array of coil elements indexed $E1, \ldots, E_N$). In such a coil array, signals from an illustrative nine coil elements, but more generally perhaps dozens of RF receive coil elements need to be transmitted. The disclosed embodiments employ frequency domain multiplexing (FDM) to transmit the signals from a large number of coils simultaneously. The disclosed FDM embodiments employ various approaches for providing a local oscillator (LO) signal for each coil that is synchronized between the coil (array) 16 and the system side RF receiver 30. In one approach, the local oscillators are located system-side and the LO signals are combined and transmitted via RF-over-fiber to the receive coil for use in heterodyning the RF signals from the various coil elements to respective RF channel frequencies. In another approach, the local oscillators are located coil-side, and the heterodyning employs bandpass filters that retain the LO signal for use at system side in demodulating the coil signals. In some embodiments, the heterodyning is performed in the analog domain using analog mixers; alternatively, at the RF receiver side this functionality can be performed in the digital domain after A/D conversion performed system-side (e.g., at the RF receiver 30) or integrated into the RF over-fiber module (e.g., integrated with the amplifier circuit 29 of the illustrative RF-over-fiber module or connection 20).

A further optional aspect is to leverage the RF-over-fiber connection to transmit power to the RF receive coil. A coil-side photodetector converts optical power transmitted from the system-side to the receive coil into electrical power. In embodiments in which the local oscillators are located system-side and the LO signals are sent to the RF receive coil via RF over fiber, the LO signals may serve as the optical power that is converted to power the RF receive coil. Alternatively, an additional dc or ac optical signal can be superimposed on the RF-over-fiber link to provide the optical power. Depending upon the configuration, the optical power may be delivered continuously to the receive coil, or alternatively a coil-side battery or storage capacitor (not shown) can be provided to store the received/converted optical power for use in powering the coil.

In this regard, it should be noted that some embodiments, by using RF-over-Fiber (RFoF) technology, the power required to run the attached coil may be reduced when compared to a coil using coil side element-by-element digitization of the MR signal picked up by the coil element(s). This power savings may be accomplished by the following. In one aspect, each coil element's signal is frequency shifted to a separate and independent band of frequency (i.e. RF channel) using passive local mixers, and the frequency shifted signals are summed to generate a FDM MR signal that is transmitted via the RFoF module, thus avoiding the need for a separate digital data "merger." In another aspect, up- and down-conversion on either side of the fiber link is frequency-synchronized by originating the LO frequencies used by the mixers on the system side, summing them onto a single channel, and using RFoF to transmit them to the coil side. They can then be extracted at each channel using a bandpass filter. In this way, the LO signals used for up/-down-conversion and recovery have the same source, eliminating problems with locking frequencies to each other on either side of the transmission gap to achieve synchronization. In another aspect, power at the coil side is saved by using passive mixers to up-/down-convert.

In another aspect, power at the coil side is saved by powering the RFoF Transmit module optically from the system side via Power-over-Fiber (PoF) technology. In another aspect, power at the coil side is saved by moving the element-by element digitization to the system-side.

Figure 2:
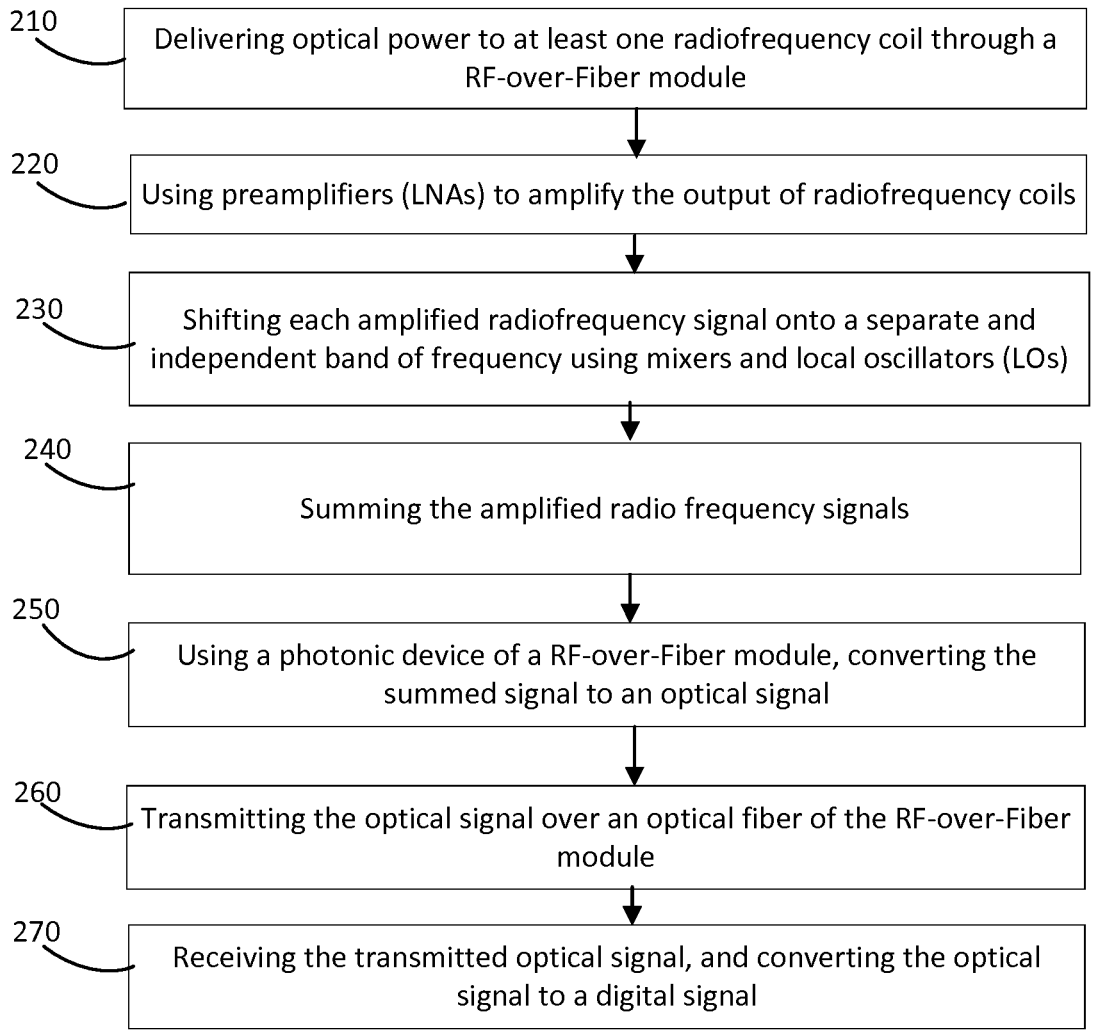
FIG. 2 diagrammatically illustrates a process for coupling an MR receive coil or coil array using RF-over-Fiber according to an embodiment.

FIG. 2 diagrammatically illustrates a process for using RF-over-Fiber according to an embodiment. With reference thereto, at 210, optical power is delivered to at least one radiofrequency coil through an RF-over-Fiber module. At 220, the one or more coil elements resonate at the MR frequency in response to an MR signal emitted by an imaging subject, and corresponding preamplifiers (LNAs) typically are provided to amplify the output of radiofrequency coil elements. At 230, each amplified radiofrequency signal is frequency shifted onto a separate and independent band of frequency (i.e. RF channel) using mixers and local oscillators (LOs). At 240, the amplified radio frequency signals are summed. Thus, the operations 230, 240 cooperate to perform frequency domain multiplexing (FDM) of the RF signals received at the MR coil elements E1, E2, . . . , $E_N$. At 250, the photonic device 24 of the RF-over-Fiber module or connection 20 converts the summed signal to an optical signal. At 260, the optical signal is transmitted over an optical fiber of the RF-over-Fiber module. At 270, the transmitted optical signal is received and converted to a digital signal and/or otherwise processed to generate MR imaging data serving as input to the MR reconstruction processor 40.

With reference to FIGS. 3-6, some illustrative implementations of the MR receive coil 16, RF-over-fiber module or connection 20, and RF receiver 30 (or, more generally, system-side MR signal receive/processing electronic hardware 30) are described.

Figure 3:
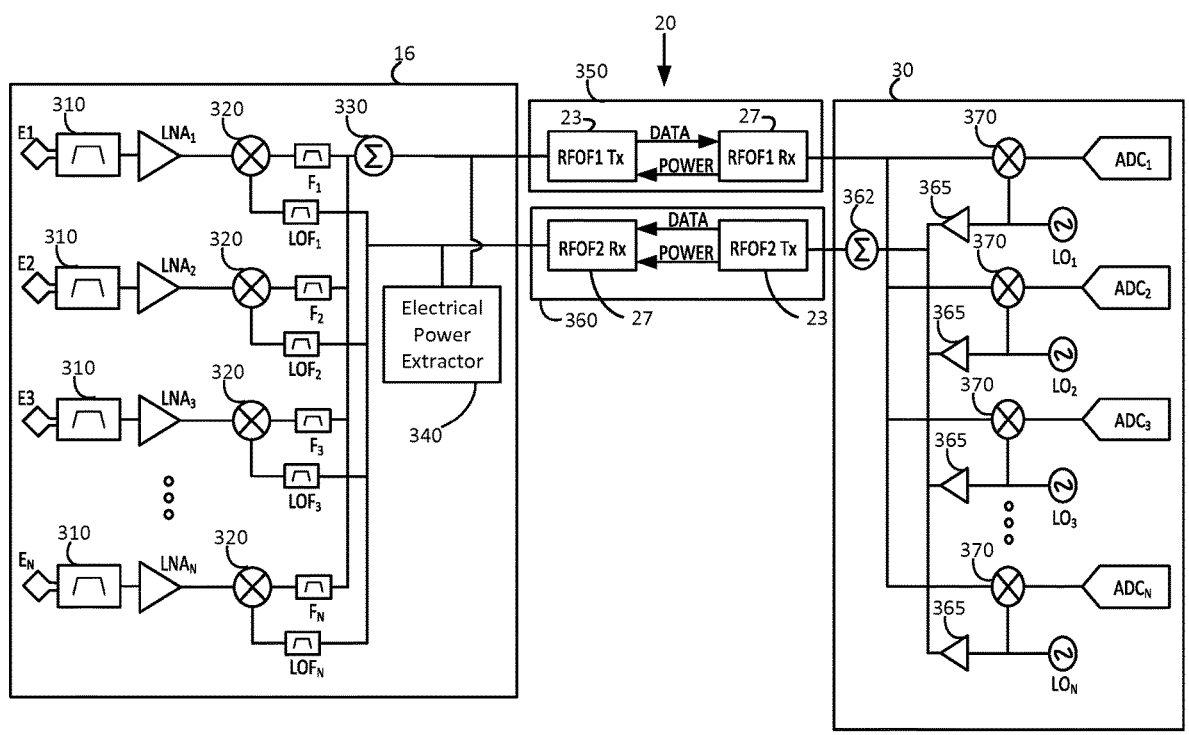
FIG. 3 diagrammatically illustrates an embodiment of the MR coil array, RF receiver, and connecting RF over fiber module of FIG. 1.

Turning now to FIG. 3, in this illustrative implementation, on the coil side (i.e. integral with the MR receive coil unit 16) are the individual receive coil elements E1, E2 . . . $E_N$, which are coupled to respective low-noise amplifiers (e.g. preamplifiers) $LNA_1$, $LNA_2$, . . . $LNA_N$, optionally via an intervening matching circuit 310 (e.g. bandpass filters), the characteristics of which are dependent upon the receive element, the specific application of the coil itself, and the LNA, and which may, or may not actually be needed in a practical realization. The signal from each LNA is limited to a specific bandwidth as a function of the MRI process and is up-converted (or down-converted; more generally, frequency shifted) to a different frequency band (i.e. RF channel) through the action of a passive (or active) mixer circuit 320. Each of these signals is optionally filtered by respective filters $F_1$, $F_2$, . . . $F_N$ to remove undesired out-of-band information and summed into a single MR signal by summer 330. In other words, the mixers 320, optional filters $F_1$, $F_2$, . . . , $F_N$, and summer 330 form frequency domain multiplexing (FDM) circuitry for multiplexing the RF signal. The FDM MR signal is then sent to the system side 30 via a first RFoF module 350 in which the optical transmit assembly 23 operatively connects with the coil unit 16 and the optical receive assembly 27 operatively connects with the system side 30. Power for the RFoF transmitter from coil to system link is optionally provided optically with PoF (this option would entail adding an optical transmitter in the receive assembly, not shown). Power for the remaining coil-side active components (LNA, signal summer, and possible detune) is supplied by a local power source such as a (not shown in FIG. 3) such as a battery (other storage capacitor, or other power storage devices; energy harvesting setups are also options). Power sent from the system side 30 may be collected by an electrical power extractor 340. In this regard, batteries or a storage capacitor or other storage device may be used to sort the energy collected by the electrical power extractor 340. Further regarding the power, the power flow is unidirectional; however, the direction that the power flows may be selected. Similarly, the dataflow is also unidirectional. Thus, when it is desired to send data in both directions, it is necessary to have two separate fibers. This is accomplished in the implementation of FIG. 3 by having two RFoF modules 350, 360 each including an optical fiber, where in the second RF-over-Fiber module or connection 360 the optical transmit assembly 23 operatively connects with the system side 30 and the optical receive assembly 27 operatively connects with the coil unit 16.

On the system side 30, the summed, up- (or down-) converted MRI signals are then recovered via a process (using a mixer 370) similar to the previous up-/down-conversion. This signal can then be digitized for later recombination. A key feature here is synchronization of the oscillator signals for up-/down-conversion of the MRI signal. Separate oscillator sources may be used on either side of the fiber interface and synchronized via phase-locking techniques. However, in the illustrated embodiment of FIG. 3, this synchronization requirement is avoided as local oscillators $LO_1$, $LO_2$, . . . $LO_N$ provide LO signals used to up-/down-convert on the coil side are originated on the system side and provided to the coil side via a second RFoF module 360. This has the advantage of providing both sides with identical reference oscillator signals (though, perhaps, phase-shifted) while keeping the power demands for the oscillator sources $LO_1$, $LO_2$, . . . $LO_N$ on the system side 30.

Figure 4:
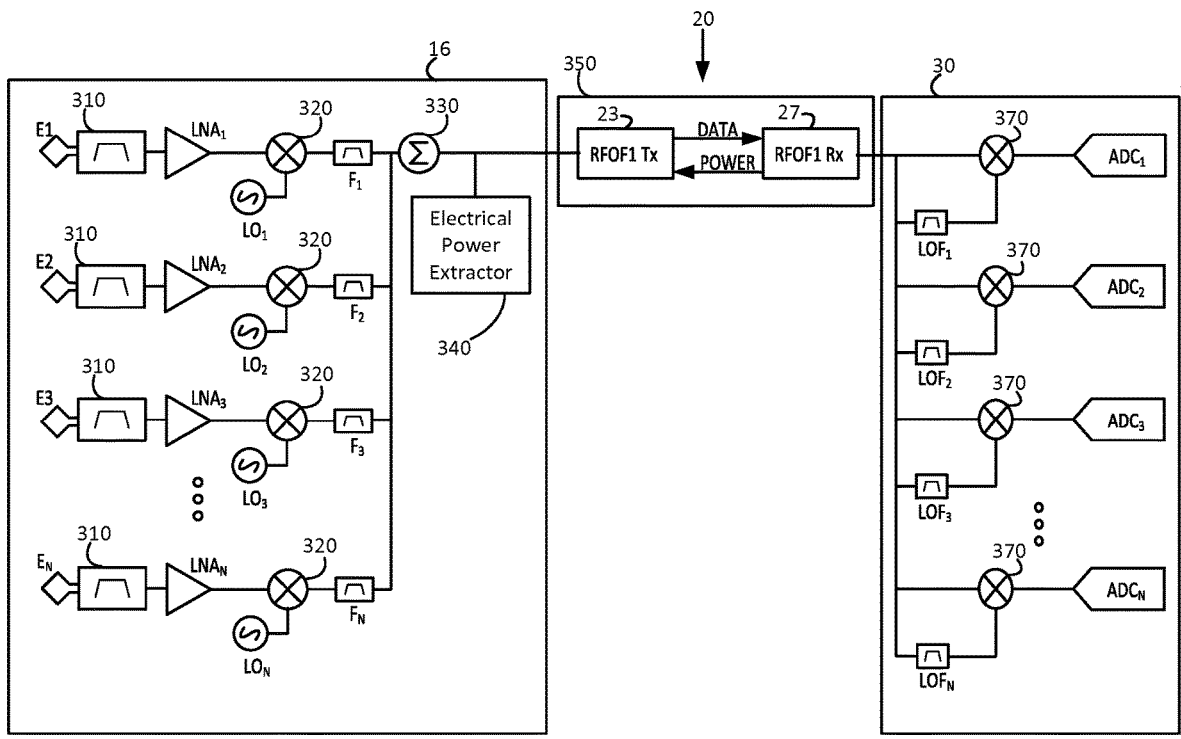
FIG. 4 diagrammatically illustrates another embodiment of the MR coil array, RF receiver, and connecting RF over fiber module of FIG. 1 with only one RF-over-Fiber module.

With reference now to FIG. 4, the oscillator signals could alternatively be generated on the coil side (i.e. the local oscillators $LO_1$, $LO_2$, . . . $LO_N$ could be components of the coil unit 16) and fed from coil 16 to the system 30 as a part of the MRI data stream. This is illustrated in the embodiment of FIG. 4. This option may require more power on the coil side, but would eliminate the need for the second RF-over-Fiber module 360 of the embodiment of FIG. 3.

It should be noted that the embodiment of FIG. 3 also includes summer 362 and amplifiers 365 on the system side, as well as band pass filters $LOF_1$, $LOF_2$, . . . $LOF_N$ on the coil side.

Figure 5:
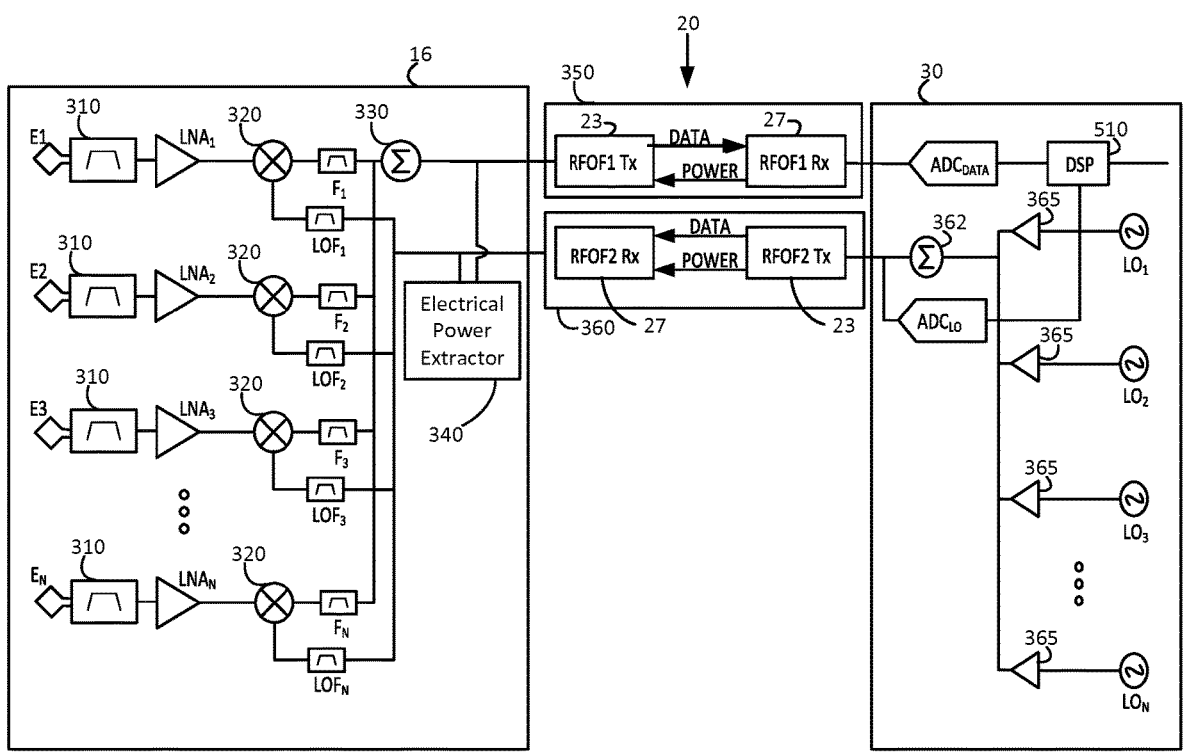
FIG. 5 diagrammatically illustrates another embodiment of the MR coil array, RF receiver, and connecting RF over fiber module of FIG. 1 including digital signal processing (DSP).

In another embodiment, shown in FIG. 5, the analog recovery of the original MRI signals is avoided by sampling and digitizing the RF signal from the RFoF module 350 and separating and recovering the individual MRI signals digitally through the digital signal processing (DSP) unit 510.

Figure 6:
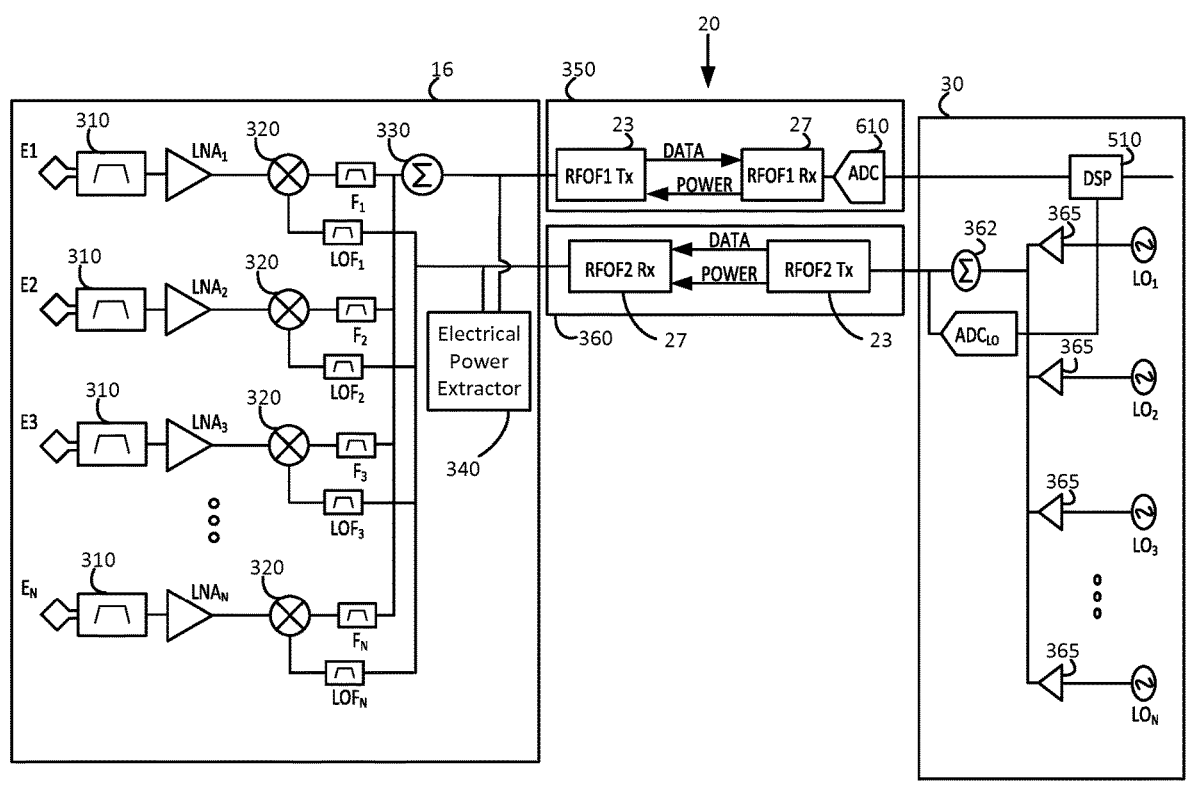
FIG. 6 diagrammatically illustrates another embodiment of the MR coil array, RF receiver, and connecting RF over fiber module of FIG. 1 including DSP and an analog-to-digital converter in the first RF-over-Fiber module.

The embodiment of FIG. 6 stretches this approach even further by including analog-to-digital converter (ADC) 610 in the RFoF module 350, and directly accessing the digital output of the RFoF module 350 before reconversion to an RF signal.

It should also be understood that some embodiments send only analog signals, and not digital signals through the RFoF modules 350, 360.

The invention has been described with reference to the preferred embodiments. Modifications and alterations may occur to others upon reading and understanding the preceding detailed description. It is intended that the exemplary embodiment be construed as including all such modifications and alterations insofar as they come within the scope of the appended claims or the equivalents thereof.

The invention claimed is:

1. A device, comprising:
   a magnetic resonance (MR) coil or coil array, including:
   a plurality of radiofrequency (RF) coil elements, wherein each RF coil element comprise a coil,
   a plurality of preamplifiers connected to outputs of corresponding RF coil elements and configured amplify outputs of the corresponding RF coil elements to generate corresponding amplified RF signals, and
   a plurality of RF mixers connected to corresponding preamplifiers, each RF mixer frequency shifting the amplified RF signal of the corresponding preamplifier to a designated frequency for that corresponding preamplifier and RF coil element;
   a first RF-over-Fiber module comprising an optical fiber, a photonic device optically coupled to send an optical signal into the optical fiber, and an RF modulator connected to modulate the optical signal by an MR signal, wherein the MR signal comprises a frequency domain multiplexed (FDM) combination of the frequency shifted amplified RF signals of the plurality of RF coil elements output by the plurality of RF mixers; and
   a second RF-over-Fiber module configured to send at least one oscillator signal to at least one of the RF mixers, and
   wherein the RF coil elements are configured to be powered at least partially by optical power conveyed to the RF coil elements via the at least one oscillator signal of the second RF-over-Fiber module.

2. The device of claim 1, wherein the second RF-over-Fiber module is configured to power the MR coil or coil array by one of:
   delivering optical power continuously to the MR coil or coil array; or
   delivering optical power to a battery or storage capacitor of the MR coil or coil array.

3. The device of claim 1, wherein the MR coil or coil array further comprises:
   at least one coil side local oscillator (LO) connected to send at least one oscillator signal to the one or more RF mixers.

4. The device of claim 1, wherein:
   the MR coil or coil array further comprises
   a summer configured to sum the frequency shifted amplified RF signals to generate the MR signal.

5. The device of claim 1, further comprising:
   an MR receiver including an analog-to-digital converter (ADCDATA) configured to:
   receive the optical signal modulated by the MR signal from the optical fiber of the first RF-over-Fiber module;
   extract the MR signal from the received optical signal and convert the MR signal to a digital signal; and
   transmit the digital signal to a digital signal processing (DSP) unit.

6. The device of claim 1, further comprising:
   an MR scanner, including a magnet configured to generate a static (B0) magnetic field;
   an RF receiver configured to receive from the first RF-over-Fiber module the optical signal modulated by the MR signal, and to extract the MR signal from the optical signal; and
   an MR reconstruction processor comprising an electronic processor programmed to reconstruct the extracted MR signal to generate therefrom a reconstructed MR image.

7. The device of claim 1, wherein the second RF-over-Fiber module comprises a second optical fiber, and is configured to transmit a plurality of oscillator signals from an RF receiver to the plurality of mixers over the second optical fiber.

8. The device of claim 7, further comprising the RF receiver, wherein the first RF-over-Fiber module is configured to provide the optical signal, modulated by the MR signal, from the MR coil or coil array to the RF receiver.

9. The device of claim 8, further comprising an RF signal combiner configured to combine the frequency shifted amplified RF signals to generate the MR signal comprising the FDM combination of the frequency shifted amplified RF signals, wherein an output of the RF signal combiner is coupled to an input of the RF modulator to couple the MR signal comprising the FDM combination of the frequency shifted amplified RF signals of the plurality of RF coil elements output by the plurality of RF mixers to the input of the RF modulator.

10. The device of claim 1, wherein all cables which are directly connected to the MR coil or coil array are non-galvanic.

11. The MR receive device of claim 1, wherein all oscillator signals of the MR coil or coil array are provided to the MR coil or coil array via the second RF-over-Fiber module from one or more local oscillators which are external to the MR coil or coil array.

12. A magnetic resonance (MR) receive device, comprising:
   a coil unit, comprising
   a plurality of radiofrequency (RF) coil elements, wherein the RF coil elements comprise a corresponding plurality of coils and are configured to output a corresponding plurality of RF signals;
   frequency domain multiplexing (FDM) circuitry, including a plurality of RF mixers and an RF signal combiner, wherein the FDM circuitry is configured to output a multiplexed MR signal in which the RF signals are frequency shifted to a plurality of RF channels of the multiplexed MR signal;
   a first RF-over-Fiber module, comprising an optical fiber, a photonic device optically coupled with the optical fiber to launch light into the optical fiber, and an RF modulator connected to modulate the light by the multiplexed MR signal; and
   a second RF-over-Fiber module connected with the coil unit and configured to convey to the plurality of RF mixers of the FDM circuitry a corresponding plurality of oscillator signals,
   wherein the coil unit is configured to be powered at least partially by optical power conveyed to the coil unit via at least one of the oscillator signals of the second RF-over-Fiber module.

13. The MR receive device of claim 12, wherein all oscillator signals of the coil unit are provided to the coil unit via the second RF-over-Fiber module from one or more local oscillators which are external to the coil unit.

14. The MR receive device of claim 12, wherein all cables which are directly connected with the coil unit are non-galvanic.

15. The MR receive device of claim 12, wherein the second RF-over-Fiber module comprises a second optical fiber, and is configured to transmit the plurality of oscillator signals from an RF receiver to the plurality of mixers over the second optical fiber.

16. The MR receive device of claim 7, further comprising the RF receiver, wherein the first RF-over-Fiber module is configured to provide the optical signal, modulated by the frequency domain multiplexed signal, from the coil unit to the RF receiver.

17. The device of claim 16, wherein the RF signal combiner is configured to combine the frequency shifted RF signals to generate the multiplexed MR signal, wherein an output of the RF signal combiner is coupled to an input of the RF modulator to couple the multiplexed MR signal to the input of the RF modulator.

18. A magnetic resonance (MR) imaging method comprising:

with a plurality of preamplifiers of a coil unit, receiving a plurality of outputs of a corresponding plurality of radiofrequency (RF) coil elements of the coil unit, and generating a corresponding plurality of amplified RF signals of the coil elements;

with the coil unit, frequency domain multiplexing the amplified RF signals of the plurality of coil elements to generate a frequency domain multiplexed signal;

with a first RF-over-Fiber module coupled to the coil unit:
using a photonic device of the RF-over-Fiber module to convert the frequency domain multiplexed signal to an optical signal modulated by the frequency domain multiplexed signal, and
transmitting the optical signal modulated by the frequency domain multiplexed signal over an optical fiber of the RF-over-Fiber module; and with a second RF-over-Fiber module which couples the coil unit to an RF receiver, sending at least one oscillator signal from an oscillator of the RF receiver to a mixer of the coil unit, wherein the mixer is connected to one of the preamplifiers.

19. The MR imaging method of claim 18, further comprising, with an analog-to-digital converter (ADCDATA) located outside the first RF-over-Fiber module:

receiving the optical signal modulated by the frequency domain multiplexed signal from the first RF-over-Fiber module; and converting the optical signal modulated by the frequency domain multiplexed signal to a digital signal representing the amplified RF signals.

\* \* \* \* \*